(12) United States Patent
Wang et al.

(10) Patent No.: US 11,250,788 B2
(45) Date of Patent: Feb. 15, 2022

(54) DISPLAY SUBSTRATE AND METHOD FOR FABRICATING THE SAME, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Haitao Wang, Beijing (CN); Guangyao Li, Beijing (CN); Qinghe Wang, Beijing (CN); Jun Wang, Beijing (CN); Dongfang Wang, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/863,045

(22) Filed: Apr. 30, 2020

(65) Prior Publication Data

US 2021/0056911 A1 Feb. 25, 2021

(30) Foreign Application Priority Data

Aug. 21, 2019 (CN) .......................... 201910773484.6

(51) Int. Cl.
*G09G 3/32* (2016.01)
*G09G 3/3275* (2016.01)
(Continued)

(52) U.S. Cl.
CPC ....... *G09G 3/3275* (2013.01); *H01L 27/3262* (2013.01); *H01L 27/3265* (2013.01); *H01L 51/5284* (2013.01); *H01L 51/56* (2013.01)

(58) Field of Classification Search
CPC .......... G09G 3/3275; H01L 2251/5392; H01L 2251/568; H01L 27/124; H01L 27/3262;
(Continued)

(56) References Cited

U.S. PATENT DOCUMENTS

2003/0117560 A1 6/2003 Yang et al.
2004/0125260 A1 7/2004 Kim et al.
(Continued)

FOREIGN PATENT DOCUMENTS

CN 107527927 A 12/2017
KR 20050060374 A 6/2005

OTHER PUBLICATIONS

First Office Action dated Mar. 29, 2021 for application No. CN201910773484.6 with English translation attached.

*Primary Examiner* — Tony O Davis
(74) *Attorney, Agent, or Firm* — Nath, Goldberg & Meyer; Joshua B. Goldberg

(57) ABSTRACT

The disclosure provides a display substrate, a method for fabricating the same, a display device. The display substrate includes a base and a display function layer on the base. The display function layer includes pixel circuits arranged in first and second directions, and data lines in the second direction. Each pixel circuit includes a driving capacitor and a driving transistor, a first electrode of the driving capacitor is in a same layer as the data lines; at least one data line includes at least one first sub-data line segment and at least one second sub-data line segment, a width of the first sub-data line segment is less than that of the second sub-data line segment, an orthographic projection of the first sub-data line on a virtual straight line in the second direction at least partially overlaps with that of the first electrode closest thereto on the virtual straight line.

18 Claims, 5 Drawing Sheets

(51) Int. Cl.
*H01L 27/32* (2006.01)
*H01L 51/52* (2006.01)
*H01L 51/56* (2006.01)

(58) Field of Classification Search
CPC ............ H01L 27/3265; H01L 27/3272; H01L 27/3279; H01L 29/78633; H01L 51/5284; H01L 51/56
See application file for complete search history.

(56) References Cited

U.S. PATENT DOCUMENTS

| | | | |
|---|---|---|---|
| 2017/0162637 A1* | 6/2017 | Choi | G09G 3/3225 |
| 2019/0326355 A1* | 10/2019 | Son | H01L 23/5228 |
| 2020/0393728 A1* | 12/2020 | Zhang | G02F 1/133391 |
| 2021/0012706 A1* | 1/2021 | Yang | G09G 3/04 |
| 2021/0026209 A1* | 1/2021 | Shin | G02F 1/133514 |
| 2021/0098557 A1* | 4/2021 | Lee | H01L 27/3223 |
| 2021/0098561 A1* | 4/2021 | Park | H01L 27/3279 |
| 2021/0143192 A1* | 5/2021 | Chen | H01L 27/1462 |
| 2021/0159284 A1* | 5/2021 | Huang | G09G 3/3225 |

\* cited by examiner

DISPLAY SUBSTRATE AND METHOD FOR FABRICATING THE SAME, DISPLAY DEVICE

CROSS-REFERENCE TO RELATED APPLICATION

This application claims priority to Chinese Patent Application No. 201910773484.6, filed on Aug. 21, 2019, the contents of which are incorporated herein by reference in the entirety.

TECHNICAL FIELD

The present disclosure relates to the field of display technology, more particularly, to a display substrate and a method for fabricating the same, and a display device.

BACKGROUND

Generally, the pixel circuits are arranged in a matrix, and data lines extending in a column direction are usually provided between the pixel circuits of adjacent columns and gate lines extending in a row direction are usually provided between the pixel circuits of adjacent rows.

SUMMARY

In one aspect, the present disclosure provides a display substrate including: a base; and a display function layer provided on the base, the display function layer includes a plurality of pixel circuits arranged in a first direction and a second direction that intersect each other, and a plurality of data lines extending in the second direction, each of the plurality of pixel circuits includes a driving capacitor and a driving transistor, a first electrode of the driving capacitor is in a same layer as the plurality of data lines, and at least one of the plurality of data lines includes at least one first sub-data line segment and at least one second sub-data line segment, a width of the first sub-data line segment in the first direction is less than a width of the second sub-data line segment in the first direction, and a first orthographic projection of the first sub-data line segment on a virtual straight line extending in the second direction at least partially overlaps with a second orthographic projection of the first electrode closest to the first sub-data line segment on the virtual straight line.

In some implementations, the display function layer further includes at least one reinforced conductor structure, each reinforced conductor structure corresponds to a respective first sub-data line segment, each reinforced conductor structure is in a same layer as a gate of the driving transistor, both ends of each reinforced conductor structure in the second direction are electrically coupled to the data line including the first sub-data line segment through first vias respectively, a third orthographic projection of the reinforced conductor structure on a virtual straight line extending in the second direction at least partially overlaps with a fourth orthographic projection of the first electrode closest to the reinforced conductor structure.

In some implementations, the first vias are communicated with a corresponding second sub-data line segment.

In some implementations, an orthographic projection of the first sub-data line segment on the virtual straight line extending in the second direction overlaps with an orthographic projection of the first electrode of the driving capacitor corresponding to the first sub-data line segment on the virtual straight line.

In some implementations, the second sub-data line segment is separated from the reinforced conductor structure corresponding to the second sub-data line segment by an interlayer insulation layer, and the first sub-data line segment is in direct contact with the reinforced conductor structure corresponding to the first sub-data line segment.

In some implementations, the reinforced conductor structure is configured to have a hollow-out structure, and the first sub-data line segment is only in direct contact with a surface of the reinforced conductor structure corresponding to the first sub-data line segment away from the base at both ends of the first sub-data line segment in the second direction.

In some implementations, the pixel circuit further includes a shielding layer and a buffer layer provided on a side of the shielding layer away from the base, and the driving transistor is provided on a side of the buffer layer away from the base, a first electrode of the driving transistor is coupled to the shielding layer through a second via, and the shielding layer is used as a second electrode of the driving capacitor.

In some implementations, the second electrode of the driving capacitor corresponding to the first sub-data line segment includes a first sub-shielding layer and a second sub-shielding layer, the first sub-shielding layer and the second sub-shielding layer are arranged in the first direction, and a gap is provided between the first sub-shielding layer and the second sub-shielding layer.

In some implementations, the second sub-shielding layer is closer to a corresponding first sub-data line segment than the first sub-shielding layer, and the first sub-shielding layer and the second sub-shielding layer are connected with each other only in a region other than an overlapping region of the first electrode and the second electrode of the driving capacitor.

In some implementations, a width of the second sub-shielding layer in the first direction is less than a width of the first sub-shielding layer in the first direction.

In some implementations, the pixel circuit further includes a first pixel electrode electrically coupled to the first electrode of the driving capacitor, a light emitting layer provided on a side of the first pixel electrode away from the base, and a second pixel electrode provided on a side of the light emitting layer away from the base.

In another aspect, the present disclosure provides a method for fabricating a display substrate, including: providing a base; and forming a display function layer on the base, the display function layer is formed to include a plurality of pixel circuits arranged in a first direction and a second direction that intersect each other, and a plurality of data lines extending in the second direction, each of the plurality of pixel circuits includes a driving capacitor and a driving transistor, a first electrode of the driving capacitor is provided in a same layer as the plurality of data lines, and at least one of the plurality of data lines includes at least one first sub-data line segment and at least one second sub-data line segment, a width of the first sub-data line segment in the first direction is less than a width of the second sub-data line segment in the first direction, and a first orthographic projection of the first sub-data line segment on a virtual straight line extending in the second direction at least partially overlaps with a second orthographic projection of the first electrode closest to the first sub-data line segment on the virtual straight line.

In some implementations, the display function layer is further formed to include at least one reinforced conductor structure, each reinforced conductor structure corresponds to a respective first sub-data line segment, each reinforced conductor structure is provided in a same layer as a gate of the driving transistor, both ends of each reinforced conductor structure in the second direction are electrically coupled to the data line including the first sub-data line segment through first vias respectively, a third orthographic projection of the reinforced conductor structure on a virtual straight line extending in the second direction at least partially overlaps with a fourth orthographic projection of the first electrode closest to the reinforced conductor structure.

In some implementations, forming a display function layer on the base includes: forming a shielding layer on the base; forming a buffer layer on a side of the shielding layer away from the base; forming an active layer of the driving transistor on a side of the buffer layer away from the base; forming a gate insulating layer on a side of the active layer away from the base; forming the gate of the driving transistor and the reinforced conductor structure in the same layer on a side of the gate insulating layer away from the base by using a patterning process; forming an interlayer insulating layer on a side of the reinforced conductor structure away from the base, including forming the first vias; and forming the first electrode and a second electrode of the driving transistor, the first electrode of the driving capacitor and the plurality of data lines in a same layer on a side of the interlayer insulating layer away from the base by using a pattering process.

In some implementations, forming an interlayer insulating layer on a side of the reinforced conductor structure away from the base further includes forming a groove for exposing the reinforced conductor structure; and in forming a first electrode and a second electrode of the driving transistor, the first electrode of the driving capacitor and the plurality of data lines in a same layer on a side of the interlayer insulating layer away from the base by using a patterning process, the first sub-data line segment is formed on the exposed reinforced conductor structure.

In some implementations, the reinforced conductor structure is formed to have a hollow-out structure, and the first sub-data line segment is only in direct contact with a surface of the reinforced conductor structure corresponding to the first sub-data line segment away from the base at both ends of the first sub-data line segment in the second direction.

In some implementations, in forming a shielding layer on the base, the shielding layer is formed to include a first sub-shielding layer and a second sub-shielding layer connected to each other, the first sub-shielding layer and the second sub-shielding layer are arranged in the first direction, a gap is provided between the first sub-shielding layer and the second sub-shielding layer, and the second sub-shielding layer is closer to a corresponding first sub-data line segment than the first sub-shielding layer.

In some implementations, the method further including: before forming the first electrode of the driving transistor, forming a second via communicated with the first sub-shielding layer, the second via is formed to couple the first electrode of the driving transistor to the first sub-shielding layer.

In some implementations, the first electrode of the driving capacitor is formed such that an orthographic projection of the first electrode on the base does not overlap an orthographic projection of a connecting portion of the first sub-shielding layer and the second sub-shielding layer on the base.

In another aspect, the present disclosure provides a display device including a display substrate described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
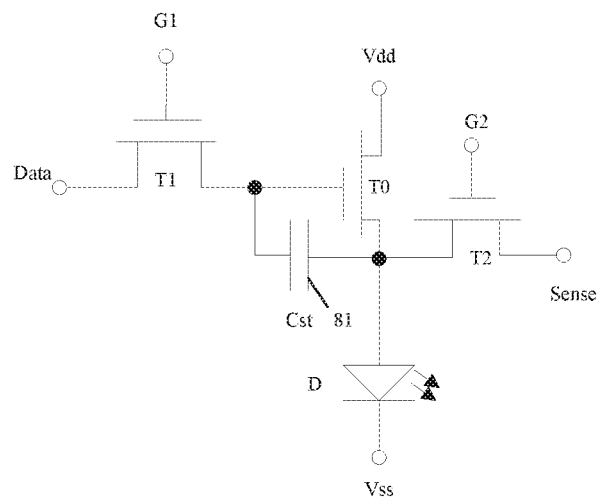
FIG. 1 is a circuit diagram of a pixel circuit in the related art.

To make those skilled in the art better understand the technical solutions of the present disclosure, the present disclosure will be further described in detail below in conjunction with the accompanying drawings and embodiments. It is noted that the following description of some embodiments are presented for purposes of illustration and description. It is not intended to be exhaustive or to limit the precise forms disclosed, and the repeated description is omitted in order to avoid redundancy.

The disclosure is described below through several specific embodiments. To make the following description of the embodiments of the present disclosure be clear and concise, detailed descriptions of known functions and known components may be omitted. When any component of an embodiment of the present disclosure appears in more than one drawing, the component is represented by a same reference numeral in each drawing.

FIG. 1 is a circuit diagram of a pixel circuit in the related art. The pixel circuit includes a driving transistor T0, a first switching transistor T1, a second switching transistor T2, a driving capacitor Cst, and a light emitting diode D. The pixel circuit further includes external signal terminals, for example, a first power terminal Vdd, a second power terminal Vss, a data input terminal Data (which is coupled to a data line), a first gate control signal terminal G1 (which is coupled to a first gate line, for example), a second gate control signal terminal G2 (which is coupled to a second gate line, for example).

Generally, an electrode of the driving capacitor Cst and the data line are provided in a same layer, that is, the electrode of the driving capacitor Cst is provided at a side of the data line. During an etching process, a slight process deviation may cause a short circuit between the electrode of the driving capacitor Cst and the data line.

Accordingly, the present disclosure provides a display substrate and a method of fabricating the same, and a display device that substantially obviate one or more of the problems due to limitations and disadvantages of the related art. In the present disclosure, by providing a reinforced conductor structure, on one hand, a problem of a short circuit between one electrode of the driving capacitor and the data line may be avoided, and on the other hand, a repair space may be increased to improve the product yield.

In one aspect, the present disclosure provides a display substrate. In some implementations, the display substrate includes: a base; and a display function layer provided on the base, wherein the display function layer includes a plurality of pixel circuits arranged in a first direction and a second direction that intersect each other, and a plurality of data lines extending in the second direction, each of the plurality of pixel circuits includes a driving capacitor and a driving transistor, first electrodes of respective driving capacitors are provided in the same layer as the plurality of data lines, at least one of the plurality of data lines includes at least one first sub-data line segment and at least one second sub-data line segment, a width of the first sub-data line segment in the first direction is less than a width of the second sub-data line segment in the first direction, and a first orthographic projection of the first sub-data line on a virtual straight line extending in the second direction at least partially overlaps with a second orthographic projection of the first electrode closest to said first sub-data line on the virtual straight line.

In the present disclosure, the phrase "being provided in the same layer" means that two elements are made of a same material and in a same layer in a laminated relationship, but this does not mean that the two elements have a same distance from the base and does not mean that other layer structures respectively between the two elements and the base are the same.

In the present disclosure, the term "patterning process" refers to a step of forming a structure having a specific pattern, e.g., a photolithography process, which includes one or more of forming a material layer, coating a photoresist, exposing, developing, etching, and resist stripping. In addition, the term "patterning process" may also be other processes such as an imprinting process and an inkjet printing process.

In the present disclosure, the term "hollow-out structure (hollow/cutout structure)" refers to, for example, a ring-shaped/annular structure with an opening in a central portion and a conductor on the periphery of the opening. The term "hollow-out groove (hollow/cutout groove)" refers to, for example, a ring-shaped/annular groove with a gap in the central portion and material on the periphery of the groove.

In the present disclosure, an expression "element A corresponding to element B" or an expression "element A facing to element B" means that an orthographic projection of the element A on a virtual straight line extending in a direction at least partially overlaps with an orthographic projection of element B on the virtual straight line.

Figure 2:
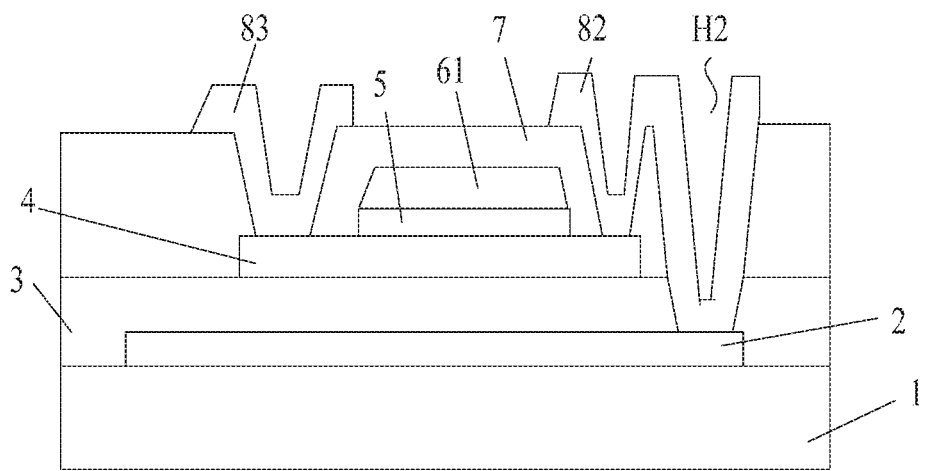
FIG. 2 is a cross-sectional view of a driving transistor in a display substrate according to an embodiment of the present disclosure.
Figure 3:
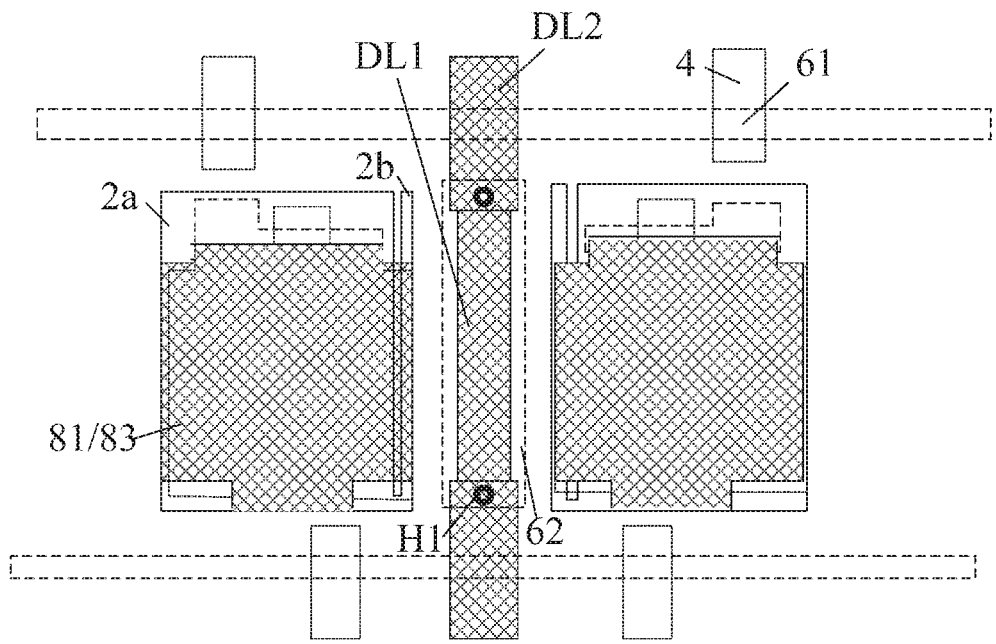
FIG. 3 is a structural diagram of a display substrate according to an embodiment of the present disclosure.

FIG. 2 is a cross-sectional view of a driving transistor in a display substrate according to an embodiment of the present disclosure, and FIG. 3 is a structural diagram of a display substrate according to an embodiment of the present disclosure. Referring to FIGS. 2 and 3, in some embodiments, the display substrate includes: a base 1 and a display function layer provided on the base 1, the display function layer includes a plurality of pixel circuits arranged in a first direction and a second direction that intersect each other, and a plurality of data lines extending in the second direction. Each of the plurality of pixel circuits includes a driving capacitor Cst and a driving transistor T0, a first electrode 81 of each of the plurality of driving capacitor Cst is in the same layer as the plurality of data lines.

It should be noted that, according to the current perspectives of the drawings, the description will be made below by using a row direction as the first direction and a column direction as the second direction. Only two pixel circuits arranged in the row direction and one data line extending in the column direction are shown in FIG. 3, but the present disclosure is not limited thereto. In some implementations, the pixel circuit may be an electrode for driving a corresponding light emitting diode D. Specifically, the structures shown in FIGS. 2 and 3 are schematic structural diagrams of some elements in the pixel circuit shown in FIG. 1. In the present disclosure, in order to highlight the inventive concept of the present disclosure, FIG. 3 does not show the entire structure of each element of the pixel circuit shown in FIG. 1. It should be understood that, for those parts not shown, those skilled in the art may configure those parts according to an equivalent circuit shown in FIG. 1. In some implementations, for example, referring to FIG. 3, the first electrode 81 of the driving capacitor Cst and a second electrode 83 of the driving transistor T0 may be combined together, and a first electrode 82 of the driving transistor T0 is not shown.

In some implementations, the first electrode 81 of the driving capacitor Cst and the data line may be formed of a same material layer by a patterning process. As shown in FIG. 2, in some implementations, a shielding layer 2 may be used as a second electrode of the driving capacitor Cst. Alternatively, the second electrode of the driving capacitor Cst may also be implemented by using another layer structure, for example, it may be implemented by providing an electrode layer separately.

Referring again to FIG. 3, the display function layer may further include at least one reinforced conductor structure 62, the data line may be divided into at least one first sub-data line segment DL1 and at least one second sub-data line segment DL2, and each reinforced conductor structure 62 may correspond to a respective first sub-data line segment DL1. In some implementations, a single data line may correspond to one reinforced conductor structure 62. Alternatively, a single data line may correspond to a plurality of reinforced conductor structures 62. The reinforced conductor structure 62 may be provided in the same layer as a gate 61 of each of the plurality of driving transistors T0. Specifically, in the embodiment shown in FIG. 3, apart of a gate line is used as the gate 61. In the layer structure where gates 61 are located, there are certain vacant regions. Therefore, the reinforced conductor structure 62 may be provided in the layer structure where the gates 61 are located.

Both ends of the reinforced conductor structure 62 in the second direction may be electrically coupled to a corresponding data line through first vias H1 respectively. Each reinforced conductor structure 62 may face to the first electrode 81 of at least one driving capacitor Cst. The data line may be divided into the first sub-data line segment DL1 and the second sub-data line segment DL2, a width of the first sub-data line segment DL1 in the first direction may be less than a width of the second sub-data line segment DL2 in the first direction, and an orthographic projection of the first sub-data line segment DL1 on a virtual straight line extending in the second direction at least partially overlaps an orthographic projection of the first electrode 81 closest to this first sub-data line segment DL1 in the first direction on the virtual straight line.

In some implementations, at least one data line is divided into at least one first sub-data line segment DL1 and at least one second sub-data line segment DL2. In some implementations, each of the reinforced conductor structures 62 corresponds to a respective one of a plurality of first sub-data line segments DL. In some implementations, an orthographic projection of each of the reinforced conductor structures 62 on the base 1 completely covers an orthographic projection of the respective one of the plurality of sub-data line segments DL1 on the base 1.

As shown in FIG. 3, a portion of the data line (i.e., the first sub-data line segment DL1) is thinner than other portions of the data line (i.e., the second sub-data line segment DL2), so that in the row direction, the relatively thin portion is farther away from the first electrode 81 of the driving capacitor Cst facing to it, thereby reducing a risk of a short circuit between the data line and the first electrode 81 of the driving capacitor Cst. In order to compensate for a larger resistance caused by the relatively thin first sub-data line segment DL1, the reinforced conductor structure 62 is coupled in parallel with the data line, thereby eliminating the larger resistance of the data line caused by the relatively thin first sub-data line segment DL1.

In some implementations, as shown in FIG. 3, one reinforced conductor structure 62 corresponds to the first electrodes 81 of two driving capacitors Cst provided on two sides of the reinforced conductor structure 62 in the first direction. Alternatively, those skilled in the art may also adjust the layout so that one reinforced conductor structure 62 corresponds to the first electrodes 81 of the two driving capacitors Cst arranged on two sides of the reinforced conductor structure 62 in the second direction, but the present disclosure is not limited thereto.

In some implementations, the first electrode 81 of the driving capacitor Cst may be formed to have various shapes, as shown in FIG. 3, so that a larger maintenance/repair space may be provided to improve the product yield.

In some implementations, the first via H1 may be communicated to the second sub-data line segment DL2. That is, as shown in FIG. 3, the first via H1 faces to the relatively thick portion of the data line. In this way, a sufficient position error margin can be provided for the first via H.

In some implementations, the both ends of the first sub-data line segment DL1 in the second direction respectively exceed the ends of the first electrode 81 of the driving capacitor Cst corresponding to the first sub-data line segment DL1 in the second direction. That is, when the first electrode 81 of the driving capacitor Cst is viewed from the first sub-data line segment DL1 in the row direction, the first sub-data line segment DL1 completely covers a boundary of the first electrode 81 of the driving capacitor Cst facing to the first sub-data line segment DL1. In this way, it can be fully ensured that the first electrode 81 of the driving capacitor Cst is far from the data line.

In some implementations, the second sub-data line segment DL2 and the reinforced conductor structure 62 are spaced apart by an interlayer insulation layer 7, and the first sub-data line segment DL1 is in direct contact with the reinforced conductor structure 62. In this way, not only a distance between the first sub-data line segment DL1 and the first electrode 81 of the driving capacitor Cst in the first direction can be increased, but a distance between the first sub-data line segment DL1 and the first electrode 81 of the driving capacitor Cst in a direction perpendicular to the display substrate (i.e., a direction perpendicular to the paper surface in FIG. 3) can be increased, thereby reducing the risk of the short circuit between the data line and the first electrode 81 of the driving capacitor Cst.

It should be noted that those skilled in the art may also set the first sub-data line segment DL1 and the first electrode 81 of the driving capacitor Cst to be at a same level with respect to the base 1. In this way, the planarization of a structure above the first sub-data line segment DL1 may be facilitated.

Figure 6A:
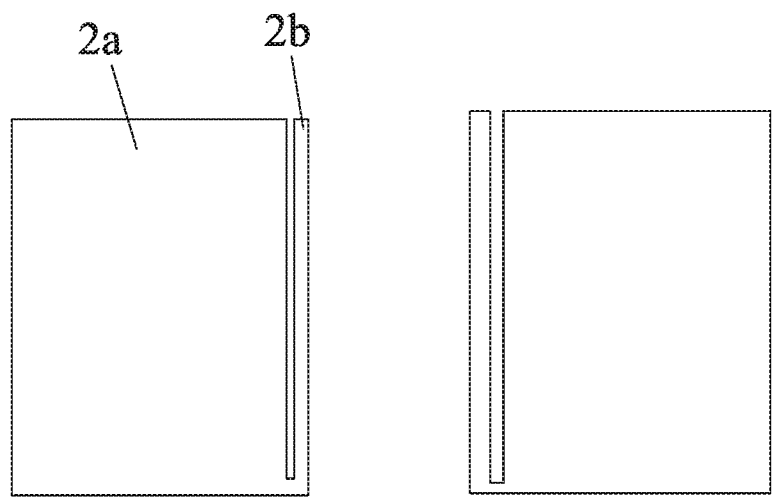
FIGS. 6a to 6c are structural diagrams of a display substrate at different fabricating stages according to an embodiment of the present disclosure.
Figure 6B:
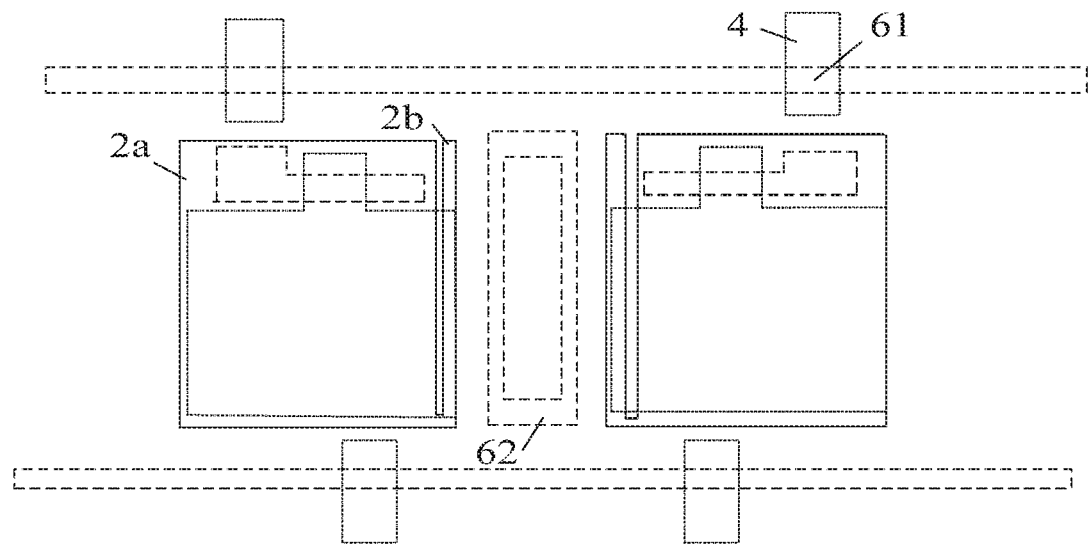
Figure 6C:
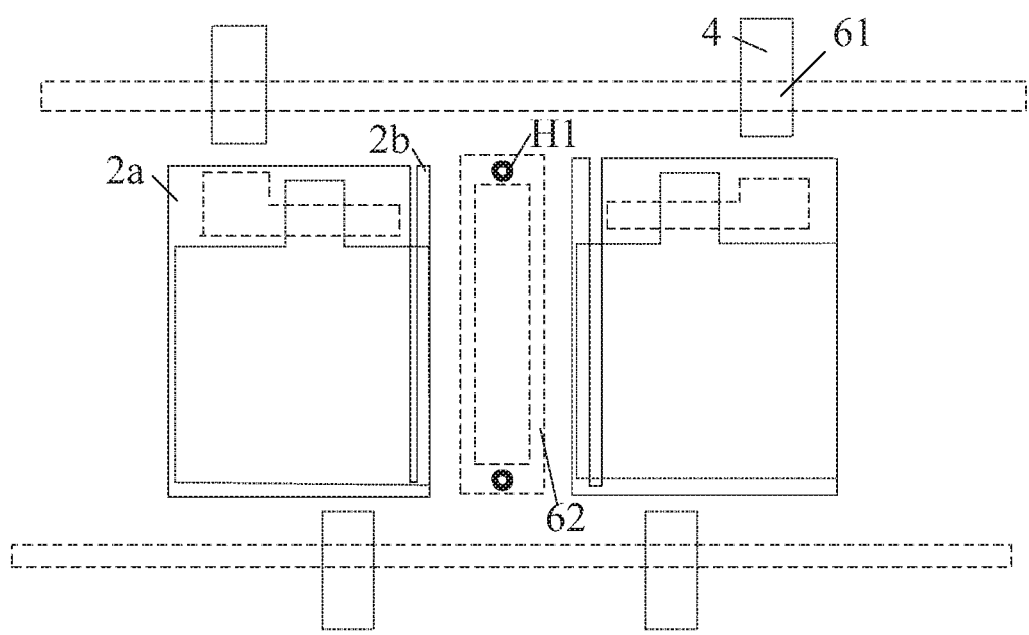

In some implementations, referring to FIG. 3 in conjunction with FIG. 6c, the central portion of the reinforced conductor structure 62 may be hollow-out, and the first sub-data line segment DL1 is only in direct contact with a surface of the corresponding reinforced conductor structure 62 away from the base at two ends of the first sub-data line segment DL1 in the second direction. In this way, a distance between the first sub-data line segment DL1 and the first electrode 81 of the corresponding driving capacitor Cst in a direction perpendicular to the base 1 can be maximized.

In some implementations, referring to FIGS. 2 and 3 in combination with FIG. 1, the pixel circuit may also include the shielding layer 2 and a buffer layer 3 on a side of the shielding layer 2 away from the base 1. The driving transistor T0 is provided on a side of the buffer layer 3 away from the base 1, the first electrode 82 of the driving transistor T0 is coupled to the shielding layer 2 through a second via H2, and the shielding layer 2 is used as the second electrode of the driving capacitor Cst.

In some implementations, the second electrode of the driving capacitor Cst corresponding to the first sub-data line segment DL1 includes a first sub-shielding layer 2a and a second sub-shielding layer 2b, the first sub-shielding layer 2a and the second sub-shielding layer 2b are arranged in the first direction with a gap between them, the second sub-shielding layer 2b is closer to the first sub-data line segment DL1, to which it faces, than the first sub-shielding layer 2a, the first sub-shielding layer 2a and the second sub-shielding layer 2b are coupled with each other only in a region other than an overlapping region of the shielding layer 2 and the first electrode 81 of the corresponding driving capacitor Cst, which will be described in detail later.

Referring to FIG. 3, taking the shielding layer 2 serving as the second electrode of the driving capacitor Cst as an example, even if the short circuit between the first sub-data line segment DL1 and the first electrode 81 of the driving capacitor Cst occurs, and the first electrode 81 and the second electrode of the driving capacitor Cst are fused and connected together at a cutting position where the short-circuited portion is cut, the first electrode 81 and the second electrode of the driving capacitor Cst may be separated from each other again by cutting the connection portion between the first sub-shielding layer 2a and the second sub-shielding layer 2b, so that the product yield can be further improved.

In some e implementations, the width of the second sub-shielding layer 2b in the first direction is less than the width of the first sub-shielding layer 2a in the first direction. That is, according to the current view angle of FIG. 3, a size of the second sub-shielding layer 2b in the left-right direction is smaller. In some implementations, the widths of the respective second sub-shielding layers 2b in the first direction may be different, and the width of the respective second sub-shielding layer 2b in the first direction should be less than the width, in the first direction, of the first sub-shielding layer 2a belonging to a same shielding layer 2 as said second sub-shielding layer 2b. In this way, when the above repair is needed, only the first sub-shielding layer 2a is finally remained as the second electrode of the driving capacitor Cst. Because the part that needs to be remained must not be too small, thereby ensuring that the capacitance value will not be reduced much.

In some implementations, the pixel circuit further includes a first pixel electrode electrically coupled to the first electrode 81 of the driving capacitor Cst, a light emitting layer provided on a side of the first pixel electrode away from the base 1, a second pixel electrode provided on a side of the light emitting layer away from the base 1, and those elements are not shown. That is, the driving capacitor Cst or the driving transistor T0 drives the light emitting diode D.

In some implementations, the light emitting layer may be an organic light emitting layer or a quantum dot light emitting layer. That is, the light emitting diode D may be an organic light emitting diode or a quantum dot light emitting diode.

In another aspect, the present disclosure provides a method of fabricating a display substrate. In some embodiments, the method for fabricating the display substrate includes: providing a base; and forming a display function layer on the base. In some implementations, the display function layer is formed to include a plurality of pixel circuits arranged in a first direction and a second direction that intersect each other, and a plurality of data lines extending in the second direction, each of the plurality of pixel circuits includes a driving capacitor and a driving transistor, a first electrode of each driving capacitor is provided in a same layer as the plurality of data lines, at least one of the plurality of data lines includes at least one first sub-data line segment and at least one second sub-data line segment, a width of the first sub-data line segment in the first direction is less than a width of the second sub-data line segment in the first direction, and a first orthographic projection of the first sub-data line segment on a virtual straight line extending in the second direction at least partially overlaps with a second orthographic projection of the first electrode of the driving capacitor closest to said first sub-data line segment on the virtual straight line.

Figure 4:
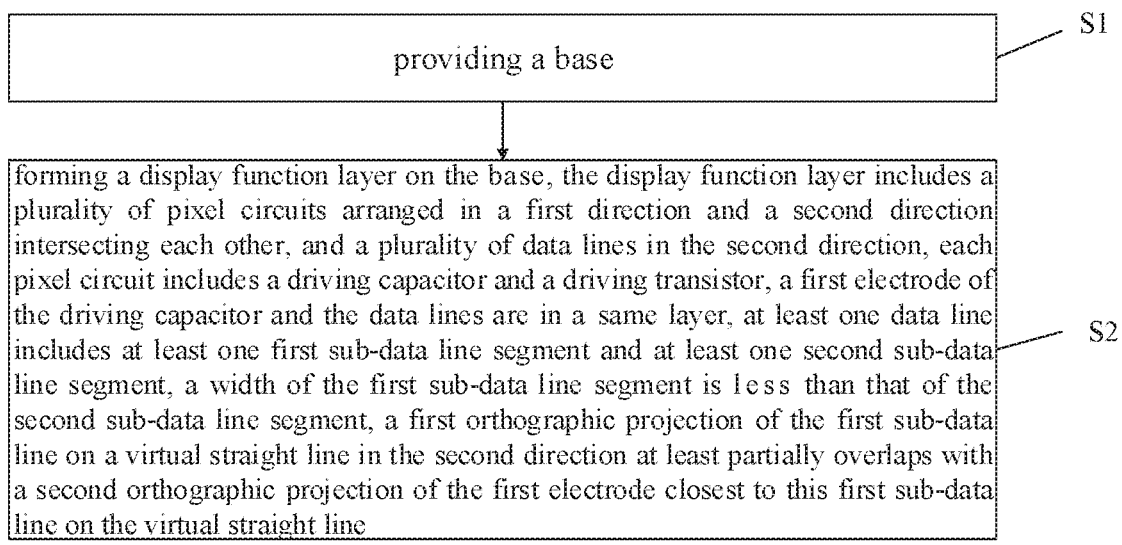
FIG. 4 is a flowchart of a method for fabricating a display substrate according to an embodiment of the present disclosure.

FIG. 4 is a flowchart of a method for fabricating a display substrate according to an embodiment of the present disclosure. Referring to FIG. 4 in combination with FIGS. 1 to 3, the method includes steps S1 and S2.

In step S1, providing a base 1.

In step S2, forming a display function layer on the base 1. The display function layer includes a plurality of pixel circuits arranged in a first direction and a second direction that intersect each other, and a plurality of data lines extending in the second direction. Each of the plurality of pixel circuits includes a driving capacitor Cst and a driving transistor T0, a first electrode 81 of the driving capacitor Cst and the plurality of data lines are provided in a same layer. The display function layer further includes at least one reinforced conductor structure 62, each reinforced conductor structure 62 corresponds to a respective first sub-data line segment, the reinforced conductor structure 62 is provided in a same layer as a gate 61 of the driving transistor T0. Both ends of the reinforced conductor structure 62 in the second direction are electrically coupled to a respective data line through first vias H1 respectively. The reinforced conductor structure 62 faces to the first electrode 81 of at least one driving capacitor Cst. At least one data line is divided into at least one first sub-data line segment DL1 and at least one second sub-data line segment DL2, a width of the first sub-data line DL1 in the first direction is less than a width of the second sub-data line DL2 in the firsts direction. An orthographic projection of the first sub-data line segment DL1 on a virtual straight line extending in the second direction at least partially overlaps with an orthographic projection of the first electrode 81 closest to said first sub-data line segment DL1 in the first direction on the virtual straight line.

In this way, the display substrate satisfying the characteristics of this embodiment may be fabricated. Thereby, a risk of short circuit between the first electrode 81 of the driving capacitor Cst and the data line is reduced.

Figure 5:
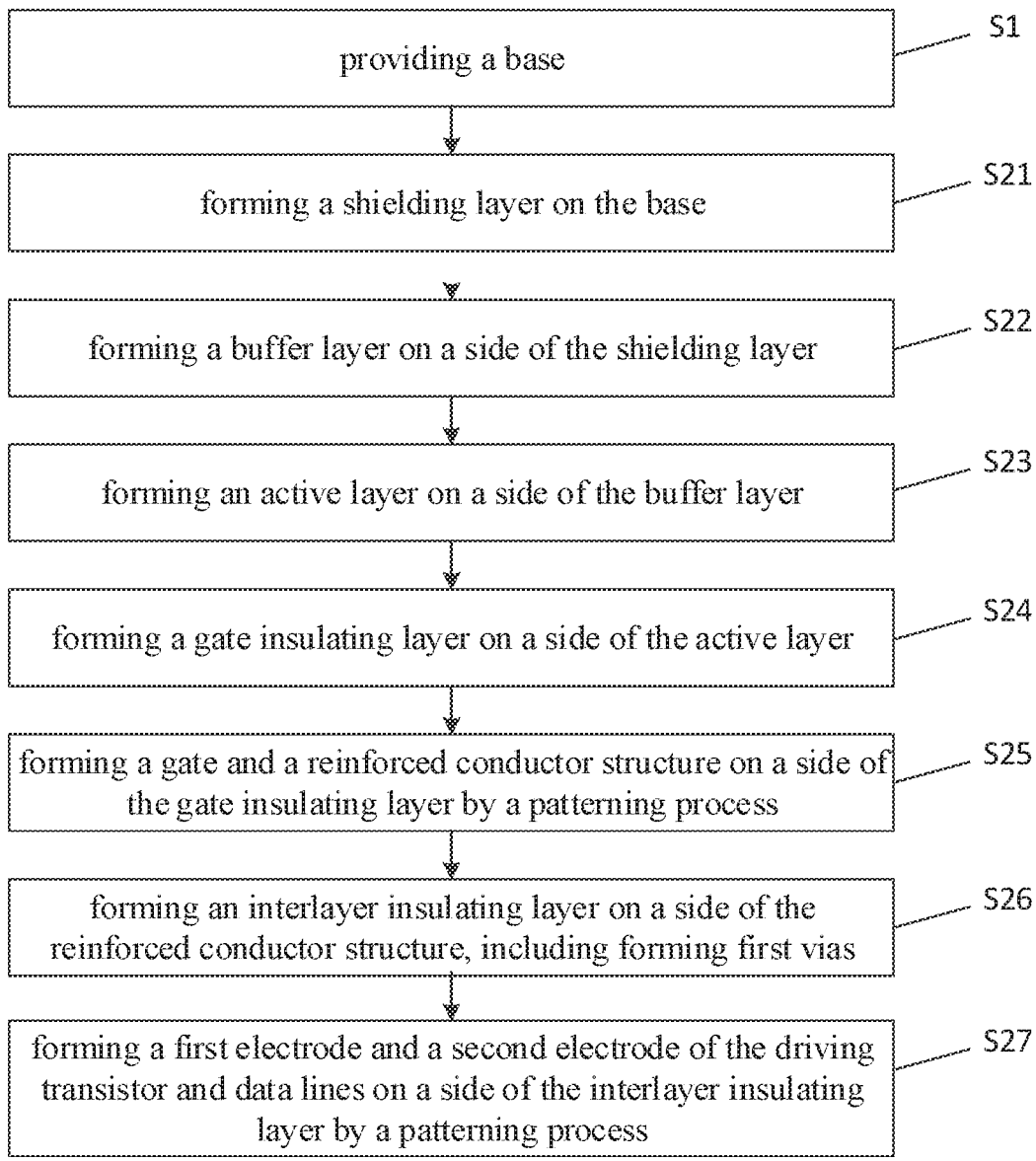
FIG. 5 is a flowchart of a method for fabricating a display substrate according to an embodiment of the present disclosure.

FIG. 5 is a flowchart of a method for fabricating a display substrate according to an embodiment of the present disclosure, and FIGS. 6a to 6c are structural diagrams of a display substrate at different fabricating stages according to an embodiment of the present disclosure. Referring to FIG. 5 in combination with FIGS. 1 to 3, and FIGS. 6a to 6c, the method includes step S1, steps S21 to S27.

In step S1, providing a base 1.

In step S21, forming a shielding layer 2 on the base 1, as shown in FIGS. 2, 5 and 6a.

In step S22, forming a buffer layer 3 on a side of the shielding layer 2 away from the base 1, the buffer layer 3 is formed to cover the shielding layer 2, as shown in FIGS. 2, 5 and 6a.

In step S23, forming an active layer 4 of the driving transistor T0 on a side of the buffer layer 3 away from the base 1, as shown in FIGS. 1, 2, 5 and 6a. In some implementations, the active layer 4 may be used for the first switching transistor T1, the driving transistor T0, and the second switching transistor T2 in FIG. 1, respectively.

In step S24, forming a gate insulating layer 5 on a side of the active layer 4 away from the base 1.

In step S25, forming a gate 61 of the driving transistor T0 and a reinforced conductor structure 62 that are provided in a same layer on a side of the gate insulating layer 5 away from the base 1 by using a patterning process. The product formed after step S25 is shown in FIG. 6b.

In step S26, forming an interlayer insulating layer 7 on a side of the gate 61 and the reinforced conductor structure 62 away from the base 1, as shown in FIGS. 2, 5 and 6c. In this step S26, a first via H1 is also formed.

In step S27, forming a first electrode 82 (not shown in FIG. 3) of the driving transistor, a second electrode 83 of the driving transistor, a first electrode 81 of the driving capacitor Cst, and the data lines that are provided in a same layer on a side of the interlayer insulating layer 7 away from the base 1, as shown in FIGS. 1, 2, 3 and 5.

In some implementations, in step S26, a groove (hollow-out groove) may also be formed to expose the reinforced conductor structure 62. In step S27, the first sub-data line segment DL1 may be formed on the exposed reinforced conductor structure 62. In this way, the second sub-data line segment DL2 is directly provided on the exposed reinforced conductor structure 62. Here, the reinforced conductor structure 62 may be a complete sheet electrode without a notch.

In some implementations, the reinforced conductor structure 62 may be formed to have a hollow-out structure, and the first sub-data line segment DL1 is in contact with a surface of the corresponding reinforced conductor structure 62 away from the base 1 only at both ends of the first sub-data line segment DL1 in the second direction. In this way, the distance between the first sub-data line segment DL1 and the first electrode 81 of the corresponding driving capacitor Cst in the direction perpendicular to the base 1 can be further increased.

In some implementations, referring to FIGS. 2 and 6a, in step S21 of forming the shielding layer 2 on the base 1, the shielding layer 2 may include a first sub-shielding layer 2a and a second sub-shielding layer 2b connected with each other. The sub-shielding layer 2a and the second sub-shielding layer 2b are arranged in the first direction with a gap therebetween. The second sub-shielding layer 2b is closer to the first sub-data line segment DL1 to which it faces than the first sub-shielding layer 2a. Before the first electrode 82 of the driving transistor is formed, a second via H2 communicating with the first sub-shielding layer 2a is also formed, so that the first electrode 82 of the driving transistor is coupled with the first sub-shielding layer 2a. In some implementations, when the first electrode 81 of the driving capacitor Cst is formed, the first electrode 81 of the driving capacitor Cst may be formed so as not to overlap a connection portion of the first sub-shielding layer 2a and the second sub-shielding layer 2b.

By means of the above method, the problem that the first electrode 81 of the driving capacitor Cst and the data line are short-circuited can be solved. In addition, in a case that the first electrode 81 of the driving capacitor Cst and the second electrode of the driving capacitor Cst (i.e., the second sub-shielding layer 2b) are short-circuited with each other during maintenance/repair, the short circuit portion between the first electrode 81 of the driving capacitor Cst and the second electrode of the driving capacitor Cst (i.e., the second sub-shielding layer 2b) will not be coupled to the connection portion of the first sub-shielding layer 2a and the second sub-shielding layer 2b. Therefore, the function of the driving capacitor Cst can be restored by cutting the connection portion of the first sub-shielding layer 2a and the second sub-shielding layer 2b.

In another aspect, the present disclosure provides a display device including a display substrate described herein or manufactured by a method described herein. In some implementations, the display device includes a display panel. In some implementations, the display panel includes a display substrate described herein or manufactured by a method described herein, and one or more integrated circuits coupled to the display substrate. Suitable display devices include, but are not limited to any products or components with display functions, such as quantum dot light emitting diode display panels, organic light emitting diode (OLED) display panels, mobile phones, tablet computers, televisions, monitors, notebook computers, digital photo frames, navigators.

It is to be understood that the above description is only for the purpose of illustrating the principles of the present disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A display substrate, comprising:
a base; and
a display function layer provided on the base,
wherein the display function layer comprises a plurality of pixel circuits arranged in a first direction and a second direction that intersect each other, and a plurality of data lines extending in the second direction, each of the plurality of pixel circuits comprises a driving capacitor and a driving transistor, a first electrode of the driving capacitor is in a same layer as the plurality of data lines,
wherein at least one of the plurality of data lines comprises at least one first sub-data line segment and at least one second sub-data line segment, a width of the first sub-data line segment in the first direction is less than a width of the second sub-data line segment in the first direction, and a first orthographic projection of the first sub-data line segment on a virtual straight line extending in the second direction at least partially overlaps with a second orthographic projection of the first electrode closest to the first sub-data line segment on the virtual straight line, and wherein
the display function layer further comprises at least one reinforcement conductor structure, each reinforced conductor structure corresponds to a respective first sub-data line segment, each reinforced conductor structure is in a same layer as a gate of the driving transistor, both ends of each reinforced conductor structure in a second direction are electrically coupled to the data line comprising the first sub-data line segment through first vias respectively, a third orthographic projection of the reinforced conductor structure on a virtual straight line extending in the second direction at least partially overlaps with a fourth orthographic projection of the first electrode closest to the reinforced conductor structure.

2. The display substrate of claim 1, wherein
the first vias are communicated with a corresponding second sub-data line segment.

3. The display substrate of claim 2, wherein
an orthographic projection of the first sub-data line segment on the virtual straight line extending in the second direction overlaps with an orthographic projection of the first electrode of the driving capacitor corresponding to the first sub-data line segment on the virtual straight line.

4. The display substrate of claim 3, wherein
the second sub-data line segment is separated from the reinforced conductor structure corresponding to the second sub-data line segment by an interlayer insulation layer, and
the first sub-data line segment is in direct contact with the reinforced conductor structure corresponding to the first sub-data line segment.

5. The display substrate of claim 4, wherein
the reinforced conductor structure is configured to have a hollow-out structure, and
the first sub-data line segment is only in direct contact with a surface of the reinforced conductor structure corresponding to the first sub-data line segment away from the base at both ends of the first sub-data line segment in the second direction.

6. The display substrate of claim 5, wherein
the pixel circuit further comprises a shielding layer and a buffer layer provided on a side of the shielding layer away from the base, and
the driving transistor is provided on a side of the buffer layer away from the base, a first electrode of the driving transistor is coupled to the shielding layer through a second via, and the shielding layer is used as a second electrode of the driving capacitor.

7. The display substrate of claim 6, wherein
the second electrode of the driving capacitor corresponding to the first sub-data line segment comprises a first sub-shielding layer and a second sub-shielding layer,
wherein the first sub-shielding layer and the second sub-shielding layer are arranged in the first direction, and
wherein a gap is provided between the first sub-shielding layer and the second sub-shielding layer.

8. The display substrate of claim 7, wherein
the second sub-shielding layer is closer to a corresponding first sub-data line segment than the first sub-shielding layer, and the first sub-shielding layer and the second sub-shielding layer are connected with each other only in a region other than an overlapping region of the first electrode and the second electrode of the driving capacitor.

9. The display substrate of claim 8, wherein
a width of the second sub-shielding layer in the first direction is less than a width of the first sub-shielding layer in the first direction.

10. The display substrate of claim 9, wherein
the pixel circuit further comprises a first pixel electrode electrically coupled to the first electrode of the driving capacitor, a light emitting layer provided on a side of the first pixel electrode away from the base, and a second pixel electrode provided on a side of the light emitting layer away from the base.

11. A method for fabricating a display substrate, comprising:
providing a base; and
forming a display function layer on the base, the display function layer is formed to comprise a plurality of pixel circuits arranged in a first direction and a second direction that intersect each other, and a plurality of data lines extending in the second direction,
wherein each of the plurality of pixel circuits comprises a driving capacitor and a driving transistor, a first electrode of the driving capacitor is provided in a same layer as the plurality of data lines,
wherein at least one of the plurality of data lines comprises at least one first sub-data line segment and at least one second sub-data line segment, a width of the first sub-data line segment in the first direction is less than a width of the second sub-data line segment in the first direction, and a first orthographic projection of the first sub-data line segment on a virtual straight line extending in the second direction at least partially overlaps with a second orthographic projection of the first electrode closest to the first sub-data line segment on the virtual straight line, and wherein
the display function layer is further formed to comprise at least one reinforced conductor structure, each reinforced conductor structure corresponds to a respective first sub-data line segment, each reinforced conductor structure is provided in a same layer as a gate of the driving transistor, both ends of each reinforced conductor structure in the second direction are electrically coupled to the data line comprising the first sub-data line segment through first vias respectively, a third orthographic projection of the reinforced conductor structure on a virtual straight line extending in the second direction at least partially overlaps with a fourth orthographic projection of the first electrode closest to the reinforced conductor structure.

12. A display device, comprising the display substrate of claim 1.

13. The method of claim 11, wherein
forming a display function layer on the base comprises:
forming a shielding layer on the base;
forming a buffer layer on a side of the shielding layer away from the base;
forming an active layer of the driving transistor on a side of the buffer layer away from the base;
forming a gate insulating layer on a side of the active layer away from the base;
forming the gate of the driving transistor and the reinforced conductor structure in the same layer on a side of the gate insulating layer away from the base by using a patterning process;
forming an interlayer insulating layer on a side of the reinforced conductor structure away from the base, comprising forming the first vias; and
forming the first electrode and a second electrode of the driving transistor, the first electrode of the driving capacitor and the plurality of data lines in a same layer on a side of the interlayer insulating layer away from the base by using a patterning process.

14. The method of claim 13, wherein
forming an interlayer insulating layer on a side of the reinforced conductor structure away from the base further comprises forming a groove for exposing the reinforced conductor structure; and
in forming a first electrode and a second electrode of the driving transistor, the first electrode of the driving capacitor and the plurality of data lines in a same layer on a side of the interlayer insulating layer away from the base by using a patterning process, the first sub-data line segment is formed on the exposed reinforced conductor structure.

15. The method of claim 14, wherein
the reinforced conductor structure is formed to have a hollow-out structure, and
the first sub-data line segment is only in direct contact with a surface of the reinforced conductor structure corresponding to the first sub-data line segment away from the base at both ends of the first sub-data line segment in the second direction.

16. The method of claim 15, wherein
in forming a shielding layer on the base, the shielding layer is formed to comprise a first sub-shielding layer and a second sub-shielding layer connected to each other, the first sub-shielding layer and the second sub-shielding layer are arranged in the first direction, a gap is provided between the first sub-shielding layer and the second sub-shielding layer, and the second sub-shielding layer is closer to a corresponding first sub-data line segment than the first sub-shielding layer.

17. The method of claim 16, further comprising:
before forming the first electrode of the driving transistor, forming a second via communicated with the first sub-shielding layer, wherein the second via is formed to couple the first electrode of the driving transistor to the first sub-shielding layer.

18. The method of claim 17, wherein
the first electrode of the driving capacitor is formed such that an orthographic projection of the first electrode on the base does not overlap an orthographic projection of a connecting portion of the first sub-shielding layer and the second sub-shielding layer on the base.

* * * * *